(12) United States Patent
Tsao (10) Patent No.: US 9,118,274 B2
(45) Date of Patent: Aug. 25, 2015

(54) RELAXATION OSCILLATOR

(71) Applicant: Princeton Technology Corporation, New Taipei (TW)

(72) Inventor: Ming-Yuan Tsao, New Taipei (TW)

(73) Assignee: Princeton Technology Corporation, New Taipei (TW)

( * ) Notice: Subject to any disclaimer, the term of this patent is extended or adjusted under 35 U.S.C. 154(b) by 7 days.

(21) Appl. No.: 14/056,093

(22) Filed: Oct. 17, 2013

(65) Prior Publication Data

US 2015/0109065 A1    Apr. 23, 2015

(51) Int. Cl.
*H03K 3/26* (2006.01)
*H03B 5/02* (2006.01)
*H03K 3/011* (2006.01)
*H03K 3/0231* (2006.01)

(52) U.S. Cl.
CPC .................. *H03B 5/02* (2013.01); *H03K 3/011* (2013.01); *H03K 3/0231* (2013.01)

(58) Field of Classification Search
CPC .............................. H03K 3/011; H03K 3/0231
USPC ................. 331/111, 143, 113 R; 327/291, 72
See application file for complete search history.

(56) References Cited

U.S. PATENT DOCUMENTS

| | | | |
|---|---|---|---|
| 3,763,322 A * | 10/1973 | Garcia et al. | .................... 341/54 |
| 7,307,485 B1 | 12/2007 | Snyder et al. | |
| 7,375,535 B1 | 5/2008 | Kutz et al. | |
| 8,058,937 B2 | 11/2011 | Qin et al. | |
| 8,159,462 B1 | 4/2012 | Seguine | |
| 8,373,502 B1 | 2/2013 | Chen et al. | |

\* cited by examiner

*Primary Examiner* — Arnold Kinkead
(74) *Attorney, Agent, or Firm* — Muncy, Geissler, Olds & Lowe, P.C.

(57) ABSTRACT

A relaxation oscillator includes a first amplifier having a first input terminal receiving an output voltage signal, a second input terminal receiving a reference voltage signal, and an output terminal comparing the output voltage signal and the reference voltage signal and in response thereto outputting a control signal; a second amplifier having a first input terminal receiving the output voltage signal, a second input terminal connected to the output terminal of the first amplifier for receiving the control signal, and an output terminal connected to the first input terminal of the first amplifier and the first input terminal of the second amplifier for comparing the control signal and the output voltage signal and in response thereto outputting the output voltage signal; and a sensing capacitor for generating the output voltage signal by charging/discharging operations by the output terminal of the second amplifier.

15 Claims, 5 Drawing Sheets

RELAXATION OSCILLATOR

FIELD OF THE INVENTION

The present invention is generally related to a relaxation oscillator, and in particular, the present invention is related to a relaxation oscillator for use with a touch panel.

BACKGROUND OF THE INVENTION

Oscillators are typically utilized as an electronic circuit for generating periodic analog signals. Generally, oscillators may be classified into two categories. One category of oscillator is termed a harmonic oscillator, which is configured to generate a sinusoidal output voltage based on self-exciting oscillation. The other category of oscillator is termed a relaxation oscillator. The relaxation oscillator is employed to generate a non-sinusoidal output voltage, such as a square-wave output voltage, a sawtooth-wave output voltage, or a triangular-wave output voltage. A conventional relaxation oscillator includes non-linear elements such as transistors for periodically releasing energy stored in capacitors or inductors, and thereby instantaneously modulating the waveform of the output signal. On the other hand, due to the flourishing development of smart phones and tablet computers, touch panels have been extensively employed as an interface for user to input signals to the computer host. The contemporary touch panel usually adopts the technique of relaxation oscillation to sense the frequency variation of the voltage generated across the capacitors located on the touch point of the touch panel, and the sensed results are further provided for back-end processors to perform analytical procedures.

In recent years, a plethora of technical research reports in connection with relaxation oscillator have been published. The publications conveying such technical research reports include U.S. Pat. No. 7,375,535 issued to Kutz et al., U.S. Pat. No. 7,307,485 issued to Snyder et al., U.S. Pat. No. 8,159,462 issued to Seguine, and U.S. Pat. No. 8,058,937 issued to Qin et al. Nonetheless, the relaxation oscillator architecture proposed in these references inevitably requires a field-effect transistor (FET) switch to be disposed on the output node of the oscillator, in which the signal input end of the FET switch is connected to a current source used for charging/discharging a capacitor, and the signal output end of the FET switch is connected to a capacitor used for generating a periodic oscillating signal. Hence, the relaxation oscillator disclosed in the aforementioned references unavoidably suffers from the clock feedthrough problems. The clock feedthrough effect would impose a voltage offset on the output signal of the FET switch, which would in turn affect the operation accuracy of the oscillator.

In addition, Chen et al. disclose another relaxation oscillator architecture in their U.S. Pat. No. 8,373,502. The relaxation oscillator taught by this reference includes an operational transconductance amplifier and an operational amplifier, and additionally includes six switches to selectively switch between a pair of reference voltages to be inputted to both input terminals of the operational transconductance amplifier and the non-inverting input terminal of the operational amplifier. In this reference, the output current signal of the operational transconductance amplifier is configured to charge/discharge a capacitor for generating a periodic oscillating signal, and the voltage signal generated across the capacitor by the output current signal is inputted to the inverting input terminal of the operational amplifier. A pair of output clock signals of the operational amplifier are complementary to each other and are fed to the control terminals of the six switches for controlling their switching operations. Although this reference avoids the deficiency of clock feedthrough by forbidding the disposal of switches between the current source used for charging/discharging the capacitor and the capacitor used for generating a periodic oscillating signal, this reference requires six switches to select the desired reference voltages. Thus, a large portion of the circuit board area will be occupied and the manufacturing cost will be heightened accordingly. What is worse, the noise induced in the circuit will be aggravated.

There is an inclination to develop a relaxation oscillator that can address the problem of clock feedthrough with a minimum number of switch elements.

SUMMARY OF THE INVENTION

A primary object of the invention is to provide a relaxation oscillator that does not dispose any switch on the output node of the relaxation oscillator in order to thoroughly eliminate the problem of clock feedthrough.

A secondary object of the invention is to provide a relaxation oscillator that can be implemented with a minimum number of switch elements, so as to reduce the occupied area of the circuit board and curtail the cost of the relaxation oscillator, and diminish the noise interference induced in the circuit.

The invention is attained by the provision of a relaxation oscillator, which includes: a first amplifier having a first input terminal receiving an output voltage signal, a second input terminal receiving a reference voltage signal, and an output terminal for comparing the output voltage signal with the reference voltage signal and in response thereto outputting a control signal; a second amplifier having a first input terminal receiving the output voltage signal, a second input terminal connected to the output terminal of the first amplifier for receiving the control signal, and an output terminal connected to the first input terminal of the first amplifier and the first input terminal of the second amplifier for comparing the output voltage signal with the control signal and in response thereto outputting the output voltage signal; and a switch assembly connected to the second input terminal of the first amplifier for being driven by the control signal to selectively connect a first reference voltage or a second reference voltage to the second input terminal of the first amplifier as the reference voltage signal. Also, the output voltage signal is a periodic oscillating signal having a non-sinusoidal waveform.

Now the foregoing and other features and advantages of the present invention will be more clearly understood through the following descriptions with reference to the accompanying drawings, in which:

DETAILED DESCRIPTION OF THE PREFERRED EMBODIMENT

The exemplary embodiments of the present invention will now be described in detail with reference to the following preferred embodiments. However, it is to be noted that various modifications can be made on the basis of the present invention, without departing from the spirit and scope of the present invention as to be encompassed within the present invention.

Figure 1:
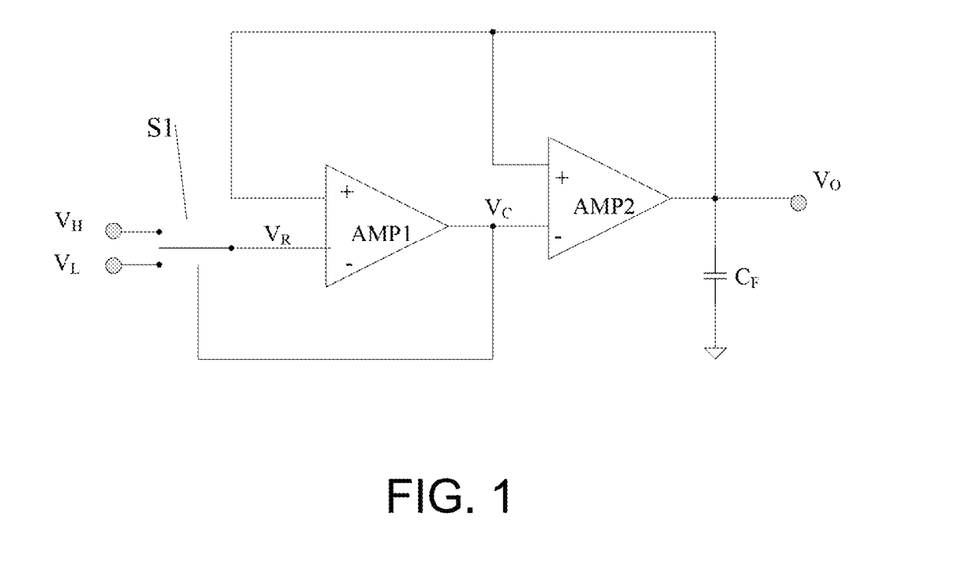
FIG. 1 is a circuit diagram showing the generic circuitry of a relaxation oscillator according to the invention.

FIG. 1 shows the backbone of the relaxation oscillator of the invention. The inventive relaxation oscillator is applicable to touch panels, however, its application is not to be limited to a precise form. Referring to FIG. 1, the inventive relaxation oscillator includes a first amplifier AMP1, a second amplifier AMP2, a switch assembly S1, and a sensing capacitor $C_F$. The first amplifier AMP1 includes an inverting input terminal, a non-inverting input terminal, and an output terminal, in which the output terminal of the first amplifier AMP1 is connected to an inverting input terminal of the second amplifier AMP2, and the inverting input terminal of the first amplifier AMP1 is connected to a reference voltage signal $V_R$. The switch assembly S1 is connected to the inverting input terminal of the first amplifier AMP1 for connecting a high reference voltage V or a low reference voltage $V_L$ to the inverting input terminal of the first amplifier AMP1 as the reference voltage signal $V_H$. The second amplifier AMP2 includes an inverting input terminal for receiving a control signal $V_C$, which can be the output voltage signal of the first amplifier AMP1. Also, the second amplifier AMP2 further includes a non-inverting input terminal and an output terminal, in which the output terminal of the second amplifier AMP2 is connected back to the non-inverting input terminal thereof and connected to the non-inverting input terminal of the first amplifier AMP1. The first amplifier AMP1 is used to compare the voltage signal received by its non-inverting input terminal with the reference voltage signal $V_R$ and in response thereto outputting the control signal $V_C$ through its output terminal. The second amplifier AMP2 is used to compare the voltage signal received by its non-inverting input terminal and the control signal $V_C$ and in response thereto outputting an output voltage signal $V_O$ through its output terminal.

The sensing capacitor $C_F$ is connected between the output terminal of the second amplifier AMP2 and a ground terminal for sensing the gesture operation of the user by touching the touch panel (not shown) with his/her fingers. The capacitance of the sensing capacitor $C_F$ is typically ranged between 10 pF and 100 pF. The sensing capacitor $C_F$ is set to be charged/discharged through the output terminal of the second amplifier AMP2, thereby generating the output voltage signal $V_O$ having a sawtooth waveform or a triangular waveform. Furthermore, the control signal $V_C$ is sent to the control terminal of the switch assembly S1 to control the switching operation of the switch assembly S1. The switch assembly S1 is typically constituted by a pair of transistor switches (not shown), in which one of the transistor switch pair has a signal input end connected to the high reference voltage $V_H$, and the other one of the transistor switch pair has a signal input end connected to the low high reference voltage $V_L$, one of the transistor switch pair has a control terminal connected to the control signal $V_C$, and the other one of the transistor switch pair has a control terminal connected to the control signal $V_C$ through an inverter (not shown). Hence, the first amplifier AMP1 is biased under a negative feedback configuration. The output voltage signal $V_O$ on the output terminal of the second amplifier AMP2 is fed back to the non-inverting input terminal of the second amplifier AMP2 and connected to the non-inverting input terminal of the first amplifier AMP1. Hence, the second amplifier AMP2 is biased under a positive feedback configuration.

Figure 2A:
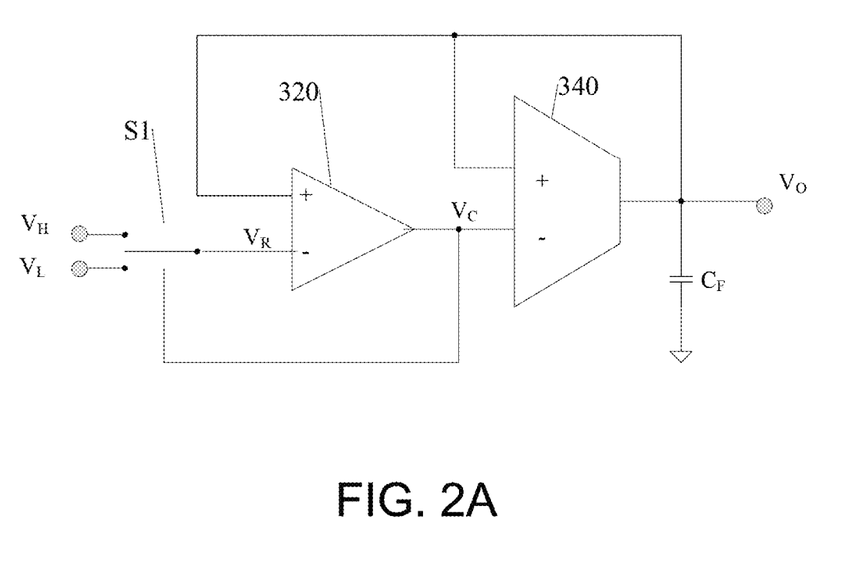
FIG. 2A is a circuit diagram showing the detailed circuitry of a relaxation oscillator according to a first embodiment of the invention.
Figure 2B:
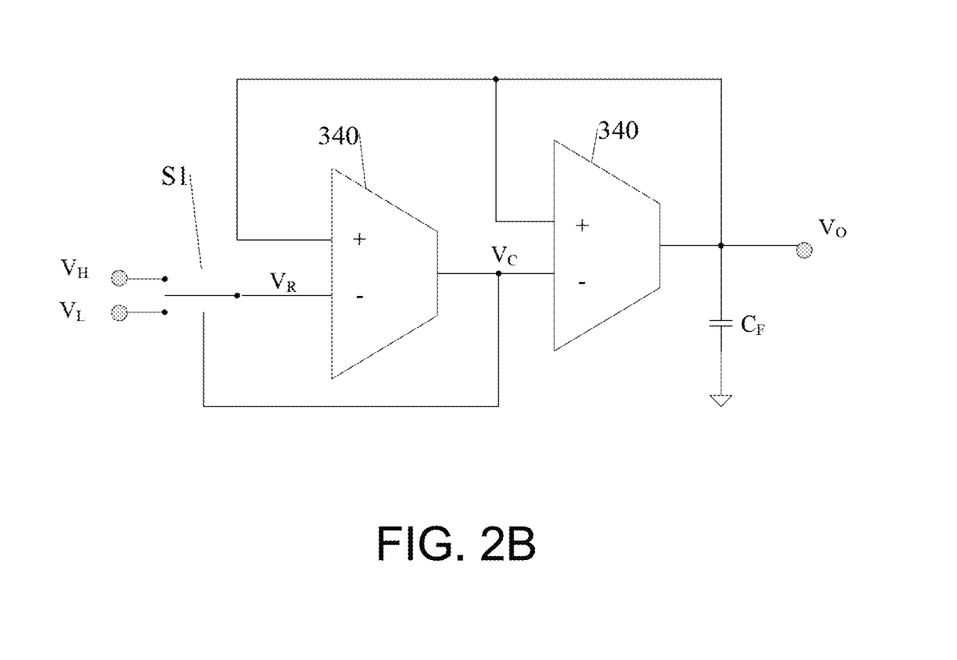
FIG. 2B is a circuit diagram showing the detailed circuitry of a relaxation oscillator according to a second embodiment of the invention.

Referring to FIG. 2A and FIG. 2B, in which FIG. 2A illustrates the detailed circuitry of a relaxation oscillator according to a first embodiment of the invention, and FIG. 2B illustrates the detailed circuitry of a relaxation oscillator according to a second embodiment of the invention. First the first embodiment will be expounded with reference to FIG. 1 and FIG. 2A, in which the first amplifier AMP1 shown in FIG. 1 is implemented by an operational amplifier 320 and the second amplifier AMP2 shown in FIG. 1 is implemented by an operational transconductance amplifier 340, as shown in FIG. 2A. The second embodiment will be expounded with reference to FIG. 1 and FIG. 2B, in which the first amplifier AMP1 shown in FIG. 1 is implemented by an operational transconductance amplifier 340 and the second amplifier AMP2 shown in FIG. 1 is also implemented by an operational transconductance amplifier 340, as shown in FIG. 2B.

Figure 2C:
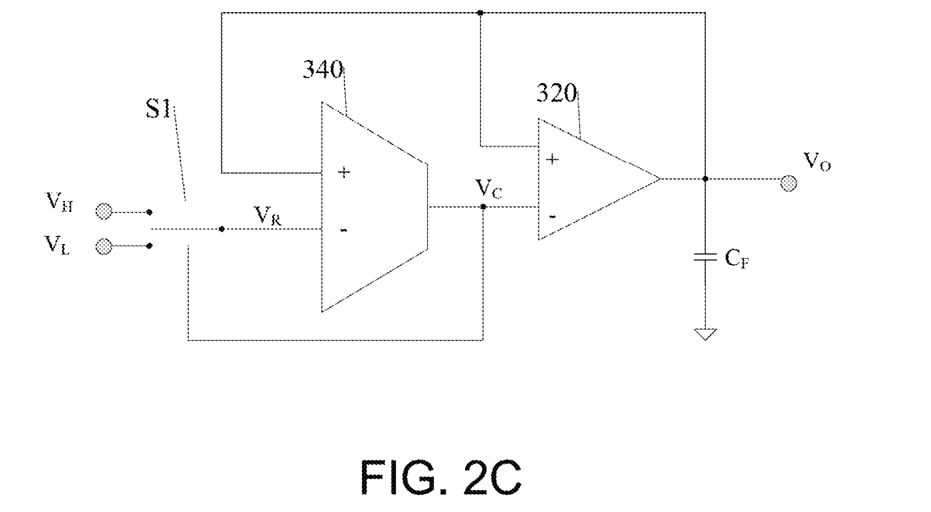
FIG. 2C is a circuit diagram showing the detailed circuitry of a relaxation oscillator according to a third embodiment of the invention.
Figure 2D:
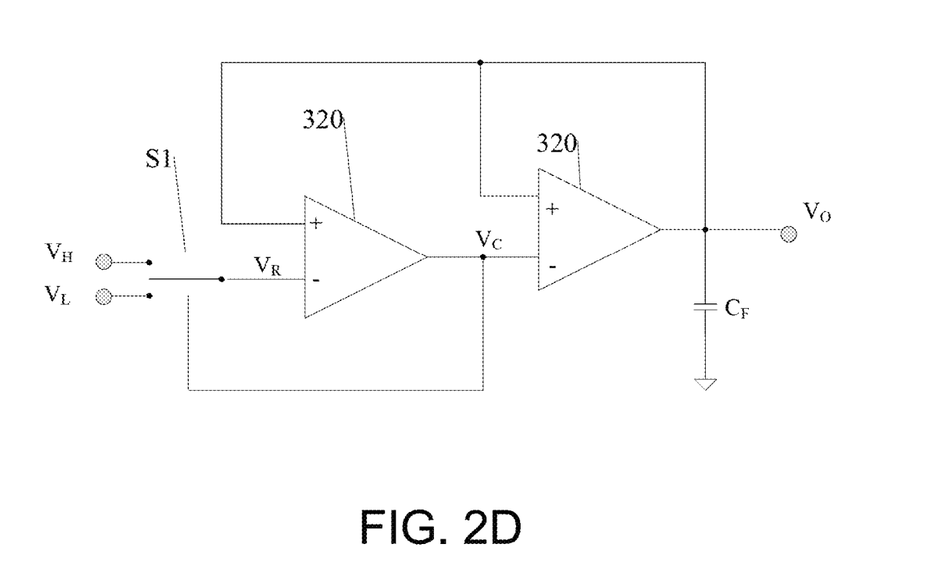
FIG. 2D is a circuit diagram showing the detailed circuitry of a relaxation oscillator according to a fourth embodiment of the invention.

Referring to FIG. 2C and FIG. 2D, in which FIG. 2C illustrates the detailed circuitry of a relaxation oscillator according to a third embodiment of the invention, and FIG. 2D illustrates the detailed circuitry of a relaxation oscillator according to a fourth embodiment of the invention. First the third embodiment will be expounded with reference to FIG. 1 and FIG. 2C, in which the first amplifier AMP1 shown in FIG. 1 is implemented by an operational transconductance amplifier 340 and the second amplifier AMP2 shown in FIG. 1 is implemented by an operational amplifier 320, as shown in FIG. 2C. The fourth embodiment will be expounded with reference to FIG. 1 and FIG. 2D, in which the first amplifier AMP1 shown in FIG. 1 is implemented by an operational amplifier 320 and the second amplifier AMP2 shown in FIG. 1 is also implemented by an operational amplifier 320, as shown in FIG. 2D.

In the preferred embodiments of the invention, the first amplifier AMP1 and the second amplifier AMP2 can be implemented by either an operational transconductance amplifier 340 or an operational amplifier 320. Regardless of whether the second amplifier AMP2 is implemented by an operational transconductance amplifier 340 or an operational amplifier 320, the input end of the second amplifier AMP2 can be considered as a capacitance when the second amplifier AMP2 is operating to charge/discharge the sensing capacitor $C_F$. Hence, if the first amplifier AMP1 is implemented by an operational amplifier 320, as is the case with the first embodiment of FIG. 2A and the fourth embodiment of FIG. 2D, the output signal of the first amplifier AMP1 is the control signal $V_C$. If the first amplifier AMP1 is implemented by an operational transconductance amplifier 340, as is the case with the second embodiment of FIG. 2B and the third embodiment of FIG. 2C, the output signal of the first amplifier AMP1 is inputted to the inverting input terminal of the second amplifier AMP2 to form the control signal $V_C$.

Figure 3A:
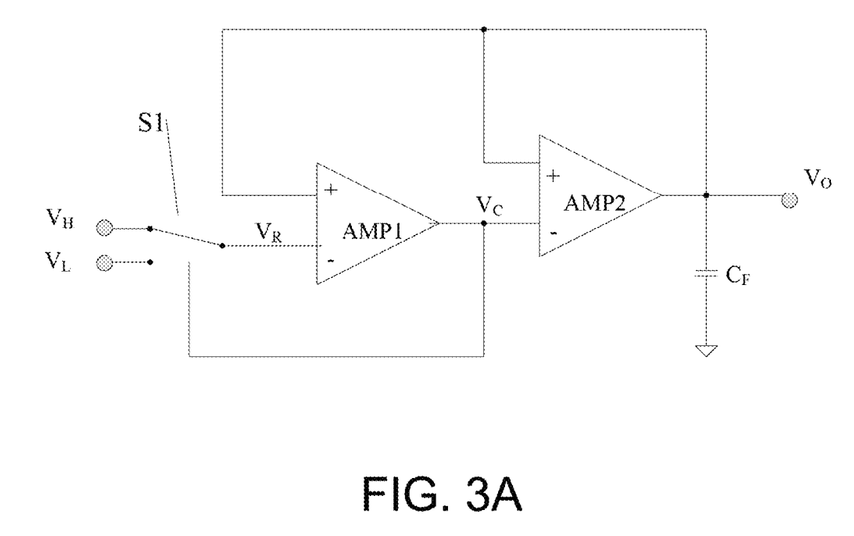
FIG. 3A is a circuit diagram showing the connection topology of the relaxation oscillator of FIG. 1 that is operating under a first operation mode.
Figure 3B:
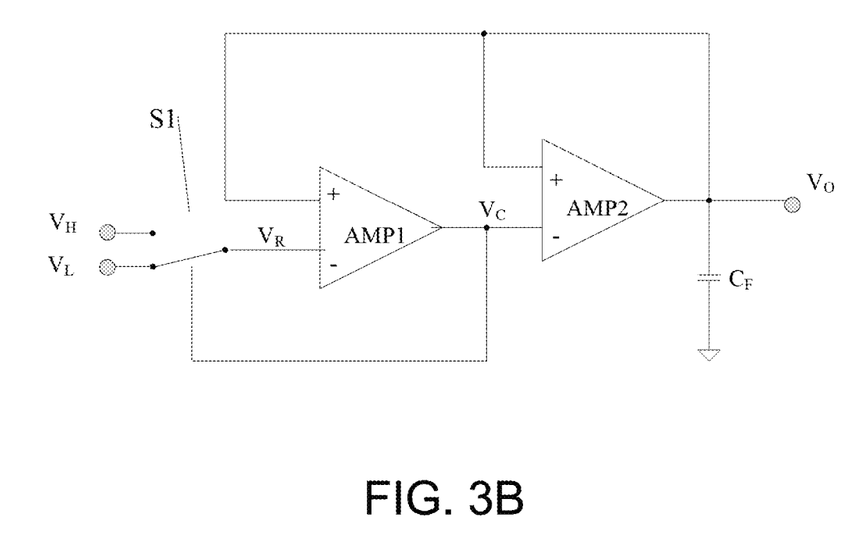
FIG. 3B is a circuit diagram showing the connection topology of the relaxation oscillator of FIG. 1 that is operating under a second operation mode.
Figure 4A:
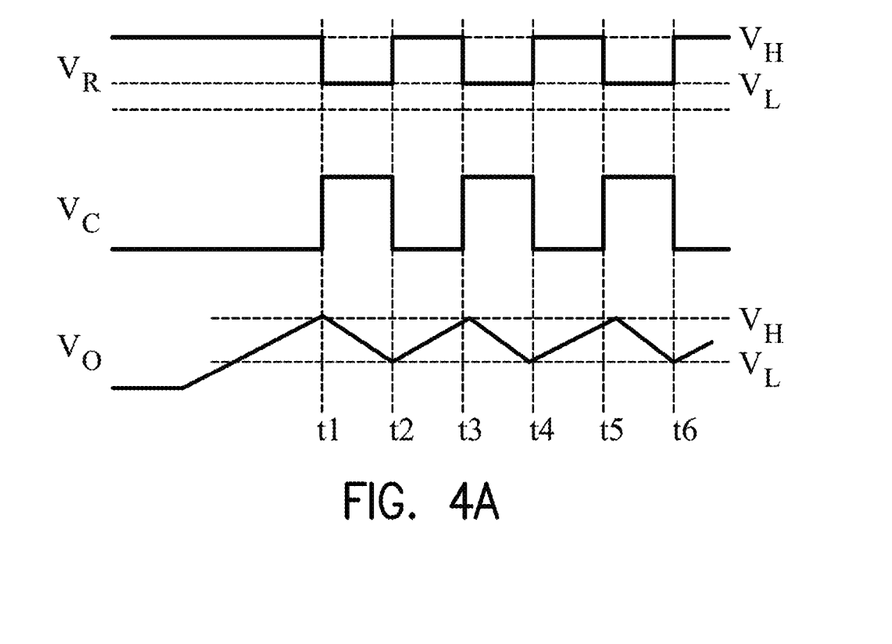
FIG. 4A is a timing diagram showing the voltage waveforms detected on the key circuit nodes of the relaxation oscillator according to the first embodiment and the second embodiment of the invention.
Figure 4B:
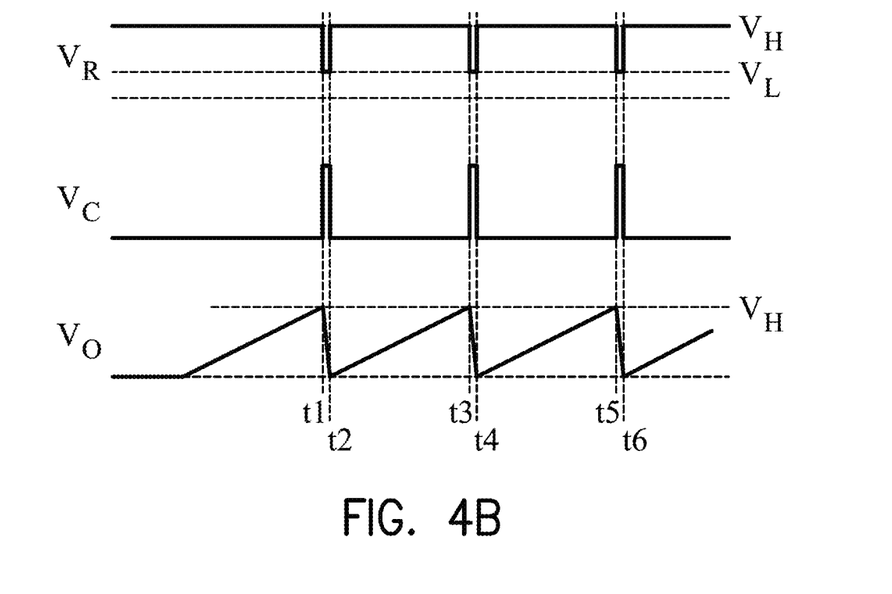
FIG. 4B is a timing diagram showing the voltage waveforms detected on the key circuit nodes of the relaxation oscillator according to the third embodiment and the fourth embodiment of the invention.

Next, the operation of the inventive relaxation oscillator will be described in detail as follows. Referring to FIGS. 3A-3B and FIGS. 4A-4B, in which FIG. 3A illustrates the connection topology of the generic relaxation oscillator architecture of FIG. 1 that is operating under a first operation mode, and FIG. 3B illustrates connection topology of the generic relaxation oscillator architecture of FIG. 1 that is operating under a second operation mode. FIG. 4A is a timing diagram showing the voltage waveforms detected on the key circuit nodes of the relaxation oscillator according to the first embodiment and the second embodiment of the invention, and FIG. 4B is a timing diagram showing the voltage waveforms detected on the key circuit nodes of the relaxation oscillator according to the third embodiment and the fourth embodiment of the invention. As described above, the second amplifier AMP2 is biased under a positive feedback configuration. That is, the non-inverting input terminal of the second amplifier AMP2 is connected to the output terminal to receive the output voltage signal $V_O$, and the inverting terminal of the second amplifier AMP2 is connected to the output terminal of the first amplifier AMP1 to receive the control signal $V_C$. Hence, the second amplifier AMP2 will compare the voltage signals received by both input terminals. If the level of the voltage signal on the non-inverting input terminal of the second amplifier AMP2 is higher than level of the voltage signal on the inverting input terminal, the output terminal of the second amplifier AMP2 will charge the sensing capacitor $C_F$. On the contrary, if the level of the voltage signal on the inverting input terminal of the second amplifier AMP2 is higher than level of the voltage signal on the non-inverting input terminal, the output terminal of the second amplifier AMP2 will drive the sensing capacitor $C_F$ to discharge. The control signal $V_C$ on the output terminal of the first amplifier AMP1 is connected to the inverting input terminal of the second amplifier AMP2 as the basis for controlling the output terminal of the second amplifier AMP2 to charge or discharge the sensing capacitor $C_F$. When the level of the control signal $V_C$ on the output terminal of the first amplifier AMP1 is high, the output terminal of the second amplifier AMP2 drives the sensing capacitor $C_F$ to discharge. On the contrary, when the level of the control signal $V_C$ on the output terminal of the first amplifier AMP1 is low, the output terminal of the second amplifier AMP2 charges the sensing capacitor $C_F$. Furthermore, the first amplifier AMP1 is biased under a negative feedback configuration, and the switch assembly S1 will be switched to connect the high reference voltage $V_H$ to the inverting input terminal of the first amplifier AMP1, thereby conforming the level of the reference voltage signal $V_R$ to the high reference voltage $V_H$. Under this condition, the relaxation oscillator will operate under a first operation mode, as depicted in the connection topology of FIG. 3A. The non-inverting input terminal of the first amplifier AMP1 is connected to the output terminal of the second amplifier AMP2 for receiving the output voltage signal $V_O$, and the level of the reference voltage signal $V_R$ on the inverting input terminal of the first amplifier AMP1 is selected to be the high reference voltage $V_H$ through the switch assembly S1. In the meantime, the level of the output voltage signal $V_O$ is lower than the level of the reference voltage signal $V_R$. That is, when the level of the output voltage signal $V_O$ is lower than the level of the reference voltage signal $V_R$, the level of the control signal $V_C$ on the output terminal of the first amplifier AMP1 is low, thereby driving the output terminal of the second amplifier AMP2 to charge the sensing capacitor $C_F$. Also, the level of the output voltage signal $V_O$ will climb up gradually, as indicated by the voltage waveforms prior to the point t1 of FIG. 4A and FIG. 4B. Accordingly, before the time reaches the point t1 of FIG. 4A and FIG. 4B, the level of the reference voltage signal $V_R$ is the high reference voltage $V_H$, the level of the control signal $V_C$ is low, and the sensing capacitor $C_F$ will be charged to drive the level of the output voltage signal $V_O$ to climb up gradually. When the time reaches the point t1, the level of the output voltage signal $V_O$ reaches the high reference voltage $V_H$. In the meantime, the switch assembly S1 will be switched to connect the low reference voltage $V_L$ to the inverting input terminal of the first amplifier AMP1, thereby setting the level of the reference voltage signal $V_R$ to the low reference voltage $V_L$. In this manner, the relaxation oscillator will operate under a second operation mode, as depicted in the connection topology of FIG. 3B. Under this condition, the level of the reference voltage signal $V_R$ on the inverting input terminal of the first amplifier AMP1 will be selected as the low reference voltage $V_L$ through the switch assembly S1. In the meantime, as the low reference voltage $V_L$ is selected to be the level of the reference voltage signal $V_R$, the level of the control signal $V_C$ on the output terminal of the first amplifier AMP1 will be transitioned to HIGH, such that the output terminal of the second amplifier AMP2 drives the sensing capacitor $C_F$ to discharge. Therefore, the output voltage signal $V_O$ on the output terminal of the second amplifier AMP2 will drop gradually, as indicated by the voltage waveforms during the period of t1-t2 of FIG. 4A and FIG. 4B. During the period of t1-t2 of FIG. 4A and FIG. 4B, the level of the reference voltage signal $V_R$ is the low reference voltage $V_L$, the level of the control signal $V_C$ is high, and the sensing capacitor continues to discharge to cause the level of the output voltage signal $V_O$ to drop gradually. When the time reaches the point t2, the level of the output voltage signal $V_O$ has dropped to the low reference voltage $V_L$. In the meantime, the switch assembly S1 will be switched to connect the high reference voltage $V_H$ to the inverting terminal of the first amplifier AMP1, such that the level of the voltage signal $V_R$ is the high reference voltage $V_H$. Under this condition, the operation mode of the relaxation oscillator will go back to the first operation mode, as indicated by the connection topology of FIG. 3A. Thus, the level of the control signal $V_C$ is transitioned to LOW to drive the output terminal of the second amplifier AMP2 to charge the sensing capacitor $C_F$, and the level of the output voltage signal $V_O$ will climb up gradually until it reaches the high reference voltage $V_H$ at the point t3. Afterwards, the sensing capacitor $C_F$ will repeatedly perform its charging/discharging process during the periods of t3-t4, t4-t5, and t5-t6. Therefore, the output voltage signal $V_O$ is formed which is a periodic oscillating signal. Thus, the details of the operations during the periods of t3-t4, t4-t5, and t5-t6 will not be given herein.

It is noteworthy that the second amplifier AMP2 is implemented by an operational transconductance amplifier 340 in the first embodiment of FIG. 2A and in the second embodiment of FIG. 2B. Generally, the output stage of an operational transconductance amplifier is a current source. Thus, if the current source on the output end of the operational transconductance amplifier 340 is used to charge the sensing capacitor $C_F$ or drive the sensing capacitor $C_F$ to discharge, the charging rate of the capacitor $C_F$ and the discharging rate of the capacitor $C_F$ will be equal to each other. Thus, the slope at the rising edge of the output voltage signal $V_O$ on the output terminal of the operational transconductance amplifier 340 will be identical to the slope at the falling edge of the output voltage signal $V_O$, as indicated by the voltage waveform of FIG. 4A. Nevertheless, the second amplifier AMP2 is implemented by an operational amplifier 320 in the third embodiment of FIG. 2C and in the fourth embodiment of FIG. 2D. The output stage of the operational amplifier is generally a NMOS common-source amplifier with current source bias or a common-emitter amplifier with current source bias. Hence, if the biasing current source on the output end of the operational amplifier 320 is used to charge the sensing capacitor $C_F$, the amplifier on the output end of the operational amplifier 320 is used to drive the sensing capacitor $C_F$ to discharge, the discharging rate of the sensing capacitor $C_F$ will be accelerated greatly as a result of the electrical characteristics of the common-source amplifier and the common-emitter amplifier. Thus, if the amplifier on the output end of the operational amplifier 320 is used to discharge the sensing capacitor $C_F$, the discharging rate of the sensing capacitor $C_F$ will be far superior to the charging rate of the sensing capacitor $C_F$. Hence, the slope at the falling edge of the output voltage signal $V_O$ on the output terminal of the operational amplifier 320 will be much larger than the slope at the rising edge of the output voltage signal $V_O$, as indicated by the voltage waveform of FIG. 4B.

Comparing the inventive relaxation oscillator with the aforementioned conventional relaxation oscillators, for example, the relaxation oscillators suggested in Kutz, Snyder, Seguine, and Qin, it is apparent that the distinguishing feature between the invention and these prior art references is that the inventive relaxation oscillator adopts an amplifier as the output stage of the relaxation oscillator, in place of the combination of current source and transistor switch used by the prior art. Thus, the invention can avoid the problem of causing error on the voltage used for charging and discharging the sensing capacitor $C_F$ as a result of clock feedthrough effect. Furthermore, comparing the inventive relaxation oscillator with Chen's relaxation oscillator, it can be understood that although Chen does not suffer from the clock feedthrough problem, Chen's relaxation oscillator has a different circuit configuration and topology with the inventive relaxation oscillator. More advantageously, the inventive relaxation oscillator requires only two switches, while Chen's relaxation oscillator requires six switches. Compared to Chen, the invention can implement a relaxation oscillator with a minimum number of switch elements, so as to reduce the occupied area of the circuit board and lower the cost of the relaxation oscillator, and attenuate the noise in the circuit. Therefore, the invention is sufficient for removing the drawbacks encountered by the prior art.

Although the structure and the operation of the inventive relaxation oscillator have been described herein, it is to be noted that those of skill in the art will recognize that various modifications can be made within the spirit and scope of the present invention as further defined in the appended claims.

What is claimed is:

1. A relaxation oscillator, comprising:
    a first amplifier having a first input terminal receiving an output voltage signal, a second input terminal receiving a reference voltage signal, and an output terminal for comparing the output voltage signal with the reference voltage signal and in response thereto outputting a control signal;
    a second amplifier having a first input terminal receiving the output voltage signal, a second input terminal connected to the output terminal of the first amplifier for receiving the control signal, and an output terminal connected to the first input terminal of the first amplifier and the first input terminal of the second amplifier for comparing the control signal with the output voltage signal and in response thereto outputting the output voltage signal; and
    a switch assembly connected to the second input terminal of the first amplifier for being driven by the control signal to selectively connect a first reference voltage or a second reference voltage to the second input terminal of the first amplifier as the reference voltage signal,
    wherein the output voltage signal is a periodic oscillating signal having a non-sinusoidal waveform.

2. The relaxation oscillator according to claim 1 wherein the first reference voltage has a different level with the second reference voltage.

3. The relaxation oscillator according to claim 1 further comprising: a sensing capacitor connected between the output terminal of the second amplifier and a ground terminal for being driven by the output terminal of the second amplifier to charge and discharge, thereby generating the output voltage signal.

4. The relaxation oscillator according to claim 1 wherein the first amplifier comprises an operational amplifier, and the second amplifier comprises an operational amplifier.

5. The relaxation oscillator according to claim 1 wherein the first amplifier comprises an operational transconductance amplifier, and the second amplifier comprises an operational amplifier.

6. The relaxation oscillator according to claim 1 wherein the first amplifier comprises an operational amplifier, and the second amplifier comprises an operational transconductance amplifier.

7. The relaxation oscillator according to claim 1 wherein the first amplifier comprises an operational transconductance amplifier, and the second amplifier comprises an operational transconductance amplifier.

8. A relaxation oscillator, comprising:
    a first amplifier having a first input terminal receiving an output voltage signal, a second input terminal receiving a reference voltage signal, and an output terminal for comparing the output voltage signal with the reference voltage signal and in response thereto outputting a control signal, wherein the first input terminal of the first amplifier is a non-inverting input terminal and the second input terminal of the first amplifier is an inverting input terminal; and
    a second amplifier having a first input terminal receiving the output voltage signal, a second input terminal connected to the output terminal of the first amplifier for receiving the control signal, and an output terminal connected to the first input terminal of the first amplifier and the first input terminal of the second amplifier for comparing the control signal with the output voltage signal and in response thereto outputting the output voltage signal, wherein the first input terminal of the second amplifier is a non-inverting input terminal and the second input terminal of the second amplifier is an inverting input terminal,
    wherein the output voltage signal is a periodic oscillating signal having a non-sinusoidal waveform.

9. The relaxation oscillator according to claim 8, further comprising a switch assembly connected to the second input terminal of the first amplifier for being driven by the control signal to selectively connect a first reference voltage or a second reference voltage to the second input terminal of the first amplifier as the reference voltage signal.

10. The relaxation oscillator according to claim 9, wherein the first reference voltage has a different level with the second reference voltage.

11. The relaxation oscillator according to claim 8, further comprising a sensing capacitor connected between the output terminal of the second amplifier and a ground terminal for being driven by the output terminal of the second amplifier to charge and discharge, thereby generating the output voltage signal.

12. The relaxation oscillator according to claim 8, wherein the first amplifier comprises an operational amplifier, and the second amplifier comprises an operational amplifier.

13. The relaxation oscillator according to claim 8, wherein the first amplifier comprises an operational transconductance amplifier, and the second amplifier comprises an operational amplifier.

14. The relaxation oscillator according to claim 8, wherein the first amplifier comprises an operational amplifier, and the second amplifier comprises an operational transconductance amplifier.

15. The relaxation oscillator according to claim 8, wherein the first amplifier comprises an operational transconductance amplifier, and the second amplifier comprises an operational transconductance amplifier.

\* \* \* \* \*